(12) United States Patent
Lynch et al.

(10) Patent No.: US 6,368,705 B1
(45) Date of Patent: Apr. 9, 2002

(54) METAL-INSULATOR-METAL DIODES AND METHODS OF MANUFACTURE

(75) Inventors: Anne T. Lynch, Needham; Eric S. Gordon, Somerville, both of MA (US)

(73) Assignee: The Gillette Company, Boston, MA (US)

( * ) Notice: Subject to any disclaimer, the term of this patent is extended or adjusted under 35 U.S.C. 154(b) by 0 days.

(21) Appl. No.: 09/293,816

(22) Filed: Apr. 16, 1999

(51) Int. Cl.$^7$ ................................................ B32B 5/16
(52) U.S. Cl. ...................... 428/323; 428/334; 428/338; 428/339; 428/458; 428/469; 428/472
(58) Field of Search ................. 428/323, 334, 428/338, 339, 357, 458, 469, 325, 472; 257/288

(56) References Cited

U.S. PATENT DOCUMENTS

| | | | |
|---|---|---|---|
| 3,933,487 A | * 1/1976 | Cowley | 96/1 |
| 4,027,231 A | 5/1977 | Lohrmann | 324/29.5 |
| 4,359,414 A | 11/1982 | Mastrangelo | 523/200 |
| 4,380,749 A | 4/1983 | Eichelberger et al. | 338/215 |
| 4,737,781 A | * 4/1988 | Robillard | 345/48 |
| 5,202,063 A | 4/1993 | Andrews et al. | 264/4.6 |
| 5,225,104 A | 7/1993 | Van Steenkiste et al. | 252/299.01 |
| 5,285,299 A | 2/1994 | Drzaic et al. | 359/52 |
| 5,340,679 A | * 8/1994 | Badesha et al. | 430/126 |
| 5,389,470 A | 2/1995 | Parker et al. | 429/90 |
| 5,397,503 A | 3/1995 | Yuasa et al. | 252/299.01 |
| 5,460,902 A | 10/1995 | Parker et al. | 429/90 |
| 5,610,511 A | 3/1997 | Parker | 324/106 |

FOREIGN PATENT DOCUMENTS

WO    WO 99/05745    4/1999

OTHER PUBLICATIONS

"All Printed Bistable Reflective Displays: Printable Electrophoretic Ink and All Printed Metal–Insulator–Metal Diodes", Massachusetts Institute of Technology, 6/98, pp. 1–19.

"Electrophoretic Displays", J.C. Lewis, 1976, pp. 223–240, No Month.

"Electrophoretic Displays", A.L. Dalisa, pp. 213–232, No Date.

"The Reinvention of Paper", Scientific American, 9/98, pp. 36, 40.

"An Electrophoretic Ink for All–Printed Reflective Electronic Displays", Comiskey et al., Nature, vol. 394, Jul. 16, 1998; pp. 253–255.

"Electronic Ink: A printable display system", Comiskey et al., 6/97, pp. 1–3.

"Easy Reader", J. Wilson, Popular Mechanics, Nov. 1998, pp. 94–96, 98.

* cited by examiner

*Primary Examiner*—Deborah Jones
*Assistant Examiner*—Stephen Stein
(74) *Attorney, Agent, or Firm*—Fish & Richardson P.C.

(57) ABSTRACT

A metal insulator diode device and method of manufacture are described. The device includes a conductive layer and a metal-insulator layer comprising particles of a refractory metal having an intrinsic oxide coating that are suspended in a dielectric binder. The device also includes a second conductive layer disposed to be in direct contact with the insulator metal layer. The conductive layers can include a metal and a dielectric filler material. In one embodiment, the metal-insulator layer comprising particles of a refractory metal such as tantalum. The metal-insulator layer can also be comprised of particles of a dielectric such as titanium dioxide to increase solids content of the metal-insulator layer.

34 Claims, 15 Drawing Sheets

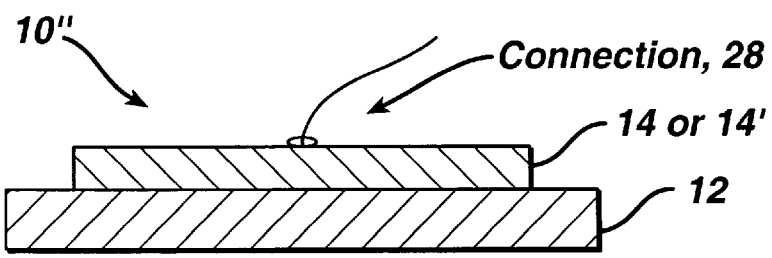
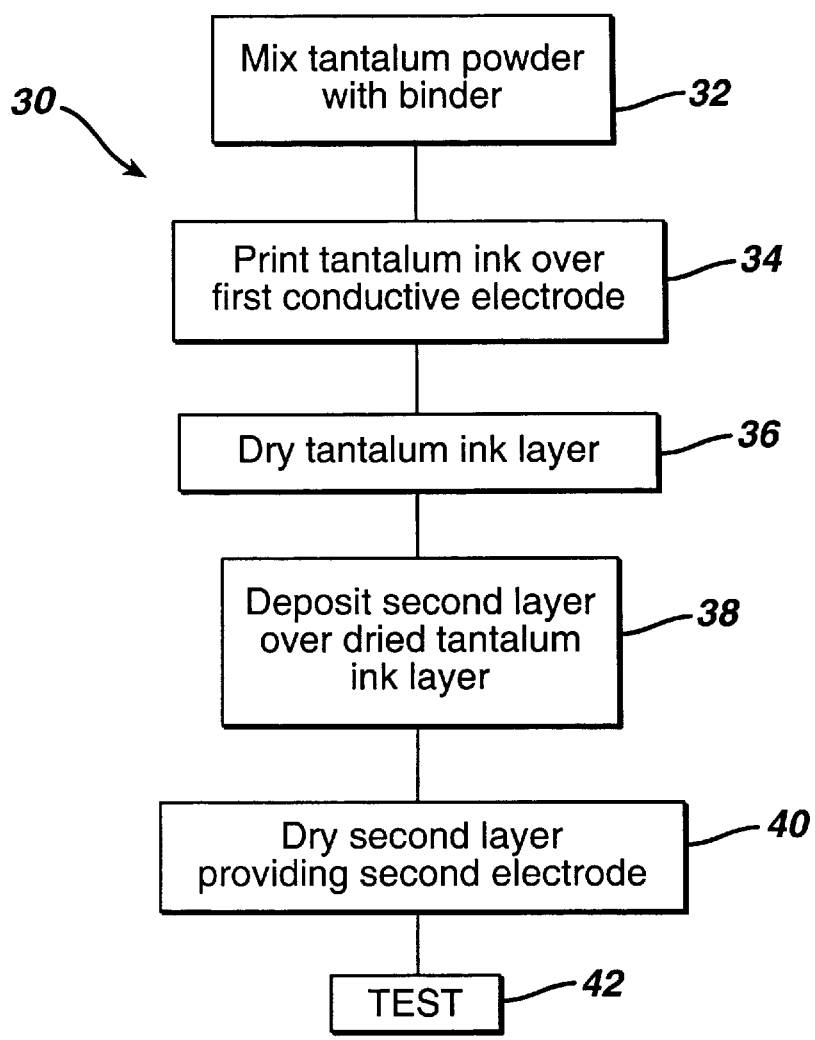

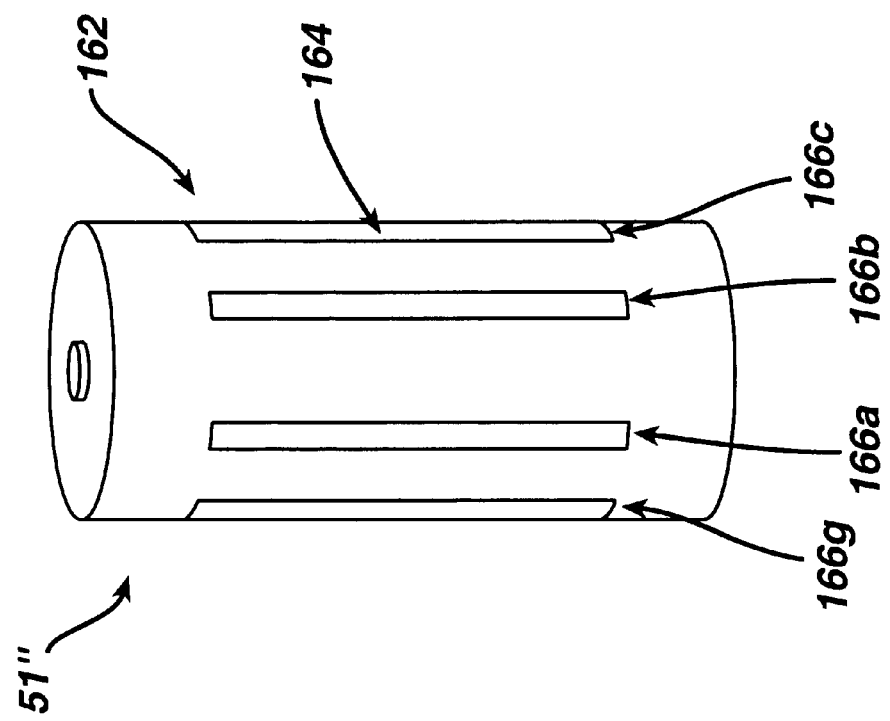
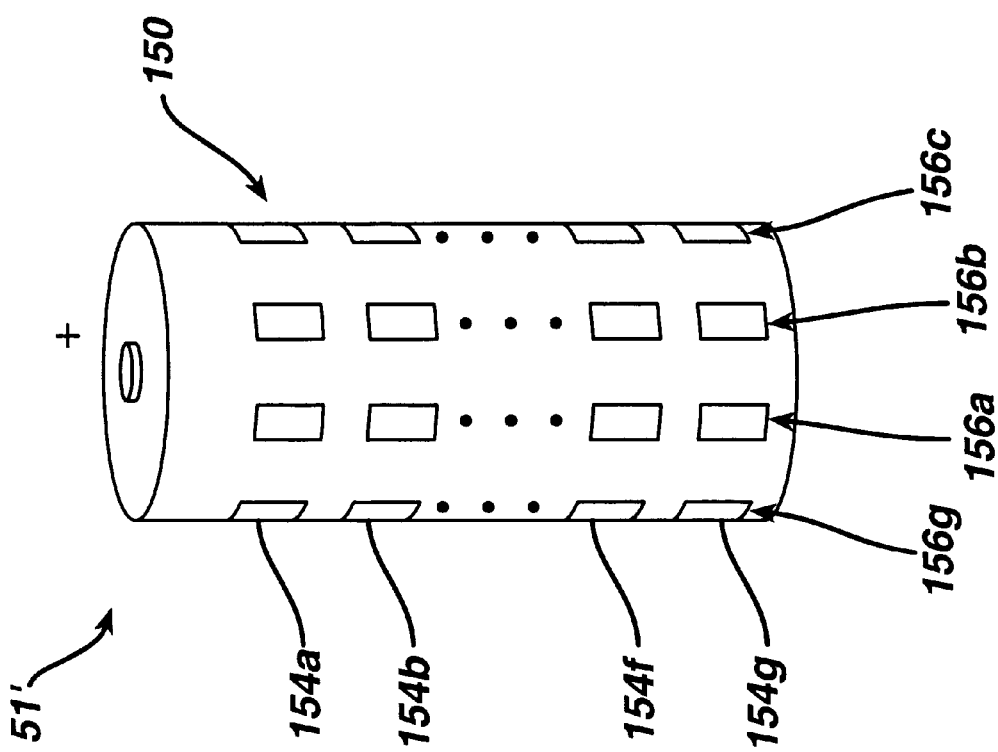

METAL-INSULATOR-METAL DIODES AND METHODS OF MANUFACTURE

BACKGROUND

This invention relates to metal-insulator-metal diodes.

A metal-insulator-metal diode (M-I-M) diode exhibits current-voltage characteristics similar to a semiconductor diode. One distinction from semiconductor diode current-voltage characteristics is that the current-voltage characteristics of a M-I-M diode are symmetrical. Typical the current-voltage characteristic curve of an M-I-M diode is bipolar. That is, at a predetermined negative voltage and substantially the same predetermined positive voltage, the M-I-M diode can switch between non-conducting and conducting states.

One type of metal-insulator-metal diode includes a composite metal-insulating layer that spaces two conductive layers, i.e., electrodes. The composite metal/insulating layer has an insulating binder, suspending metal particles having a relatively thick, thermally grown or deposited oxide layer on the metal particles. In a thesis of Jaeyong Park entitled "All Printed Bistable Reflective Displays: Printable Electrophoretic Ink and All Printed Metal-Insulator-Metal Diodes" Massachusetts Institute of Technology June 1998, two types of processes for producing such metal-insulator-metal diodes are described. The thesis describes a thermal annealing process and an anodized process.

In thermal annealing, a thick deliberately deposited tantalum oxide layer is formed about the tantalum particles. An ink is produced by incorporating the tantalum particles with the deliberately grown oxide into a binder. The tantalum oxide powder is prepared, prior to mixing with the binder by thermally annealing tantalum powder in an oven for a period of time at a temperature between 250 and 400° C. in an oxidizing atmosphere. Once the powder is oxidized it is mixed with a binder and screen printed onto a copper foil substrate. That assembly is dried and after cooling, a chromium ink layer is placed on the tantalum-binder ink layer through screen printing.

In the anodized process, a tantalum powder is mixed with a polymer binder and printed on top of the copper surface. This assembly is placed in an electrolyte solution to anodize i.e., grow an anodic oxide layer over the exposed surfaces of the tantalum material, that is, those portions of the tantalum that are not submerged in the polymer binder. A chromium layer is printed on top of the anodic oxide.

The current-voltage characteristic curves of either device provide a distinctive symmetrical diode response, where the switching voltages of the response is dependent upon the oxide thickness, how long it is heated and at what temperature it is heated to in the oven. Generally the reported switching voltages are in the range of 50 to 80 volts.

SUMMARY

The switching voltage characteristic of known M-I-M devices is too high for many applications that require low switching voltages. The diodes described herein can achieve switching voltages less than those of the prior art. In particular, the diodes can achieve switching voltages less than volts, generally less than 2 volts, and in particular less than 1 volt down to 0.5 volts or so.

According to an aspect of the invention, a metal insulator device includes a conductive layer and a metal-insulator layer of particles of a metal that forms a surface layer of an intrinsic oxide when exposed to an ambient of oxygen. The particles having the intrinsic oxide are suspended in a dielectric binder.

The device can also includes a second conductive layer disposed to be in direct contact with the metal-insulator layer. The particles can be any metal that form oxides that are self-limiting, stable, and have a suitable dielectric constant for the application. Examples of metals include tantalum and niobium.

According to a further aspect of the invention, a metal insulator diode device includes a conductive layer and a metal-insulator layer comprising particles of a metal that forms an intrinsic oxide surface layer over the particles when exposed to an ambient of oxygen, with the particles suspended in a dielectric binder vehicle. The device also includes a second conductive layer disposed to be in direct contact with the insulator metal layer, with said insulator metal further comprising a dielectric filler material.

According to a still further aspect of the invention a method of fabricating a metal-insulator-metal device includes printing over a first conductive layer, a layer comprised of a binder and tantalum particles having oxide surface layers with a thickness in a range of one to several, e.g., 10 or so monolayers.

One or more of the following advantages may be provided by one or more aspects of the invention. Using an intrinsic oxide coating for the tantalum metal provides an oxide layer of relatively uniform thickness. Bulk thermal oxidation of the tantalum can be very inconsistent producing a very surface oriented device having electrical characteristics that may be difficult to predict or control. In a bulk sample, tantalum on the surface may be oxidized more than the tantalum material on the bottom of the sample.

The intrinsic oxide is easier to control and will not go all the way through to 100% oxidation which would yield 100% tantalum oxide powder. The combination of the metal particles having intrinsic oxide and the binder also avoids potential formation of pinholes in the oxide layer which is a problem for conventional M-I-M diodes. Pinholes in the tantalum oxide layer can cause shorting of a diode having the tantalum oxide layer. The tantalum oxide layer is uniform allowing excellent contact to conductive electrodes.

Typically, in conventional M-I-M diode devices, a thick oxide is deposited on the first conductor to minimize pinhole formation. This thick oxide provides diodes that switch at the relatively high switching voltages of 50 to 80 volts mentioned above. The arrangement of the present diode allows for much lower switching voltages than those of the prior art.

BRIEF DESCRIPTION OF THE DRAWINGS

FIG. 3 is cross-sectional view of another alternative M-I-M diode structure.

FIG. 4 is a flow chart of a process to manufacture the device of FIG. 1.

FIG. 11 is a perspective view of a battery cell having a segmented display battery tester disposed about a circumference of the battery.

FIG. 12 is a perspective view of a battery cell having a variable display battery tester disposed about a circumference of the battery.

DESCRIPTION

Figure 1:
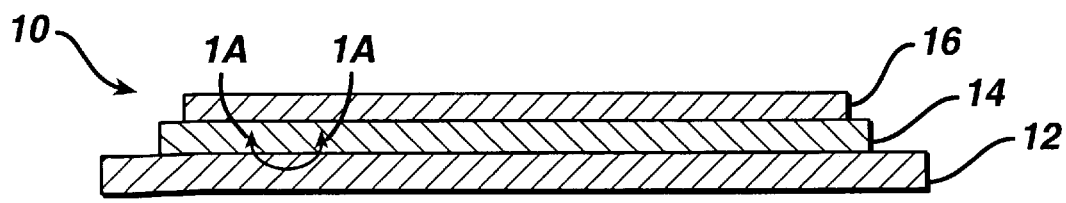
FIG. 1 is a cross-sectional view of an M-I-M diode structure.
Figure 1A:
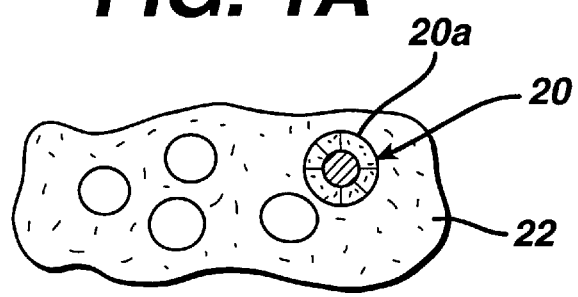
FIG. 1A is a blowup view taken along line 1A—1A of a portion of FIG. 1.

Referring now to FIG. 1, a metal-insulator-metal diode is shown. The metal-insulator-metal diode 10 includes a first electrode 12, e.g., a copper foil substrate or another conductive material such as carbon or gold or other conductive materials such as chromium, tungsten, molybdenum, or other conductive materials such as metal particles dispersed in a polymer binder such as a conductive ink. The metal-insulator-metal diode 10 further includes a composite metal-insulator layer 14 comprised of metal particles 20 suspended in a dielectric binding layer 22. As shown in FIG. 1A, the metal particles 20 have an intrinsic oxide layer 20a that covers the surface of the particles 20. One preferred metal is tantalum that readily forms an intrinsic, stable and generally uniform intrinsic oxide layer 20a. Other metals can be used such as niobium. These other metals should form oxides that are self-limiting, stable, and having a suitable dielectric constant for the application. One reason that tantalum is preferred is that the intrinsic oxide layer forms readily on tantalum upon its exposure to air.

Disposed on the composite metal-insulating layer 14 is a second electrode 16 also comprised of e.g., copper or another conductive materials such as a carbon, chromium, tungsten, molybdenum, or gold or other conductive materials. The second electrode is preferably disposed directly on the layer 12 to be in contact with the intrinsic oxide layer 20a on the particles 20. The second electrode also can be a composite layer including the conductive materials and a binder. By varying the conductivity of the electrode layer 16, the electrical characteristics of the device 10 can be changed. Specifically, the I-V characteristic curve can be made sharper to obtain a steeper on/off characteristic. That is, the higher the electrical conductivity, the sharper the curve.

As will be described below in FIGS. 5A–5D, the M-I-M device has a symmetrical current-voltage (I-V) characteristic curve exhibiting diode-like properties. The device also can be made to have lower switching voltages than other approaches, e.g., less than 10 volts and more specifically less than 1 volt to about 0.5 volts but with the same symmetrical properties. By varying the ratio of the tantalum to the binder and also the thickness of the tantalum-binder layer enables shifting of the I-V characteristic curve for the same material up or down within a range of plus/minus 50% or more.

The switching voltage of the device 10 can be more consistent from device to device. This may occur due in part to the more consistent oxide layer thickness and quality of the intrinsically formed oxide. The thickness of the tantalum oxide layer 20a does not vary widely compared to thermal annealing or anodized oxide layers. It is believed that the intrinsic layer 20a also has a substantially uniform thickness from tantalum particle 20 to tantalum particle 20 that is on the order of monolayers of thickness. Characteristics of the tantalum particles are that the powder has a particle size in a range less than 0.5 microns up to about 10's of microns. The printed layer 14 can have a thickness less than 0.5 mils up to 8–10 mils. Other particle sizes and thicknesses could be used herein.

Figure 2:
FIG. 2 is a cross-sectional view of an alternative M-I-M diode structure.
Figure 2A:
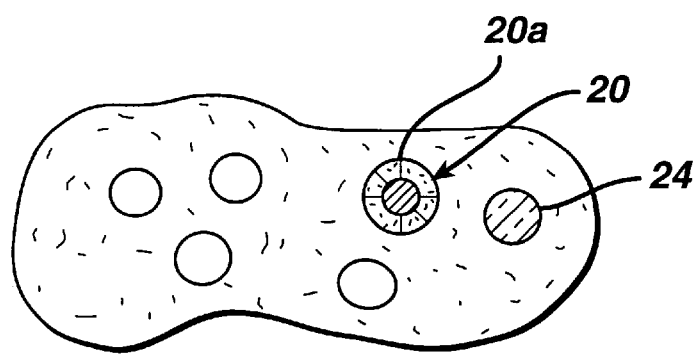
FIG. 2A is a blowup view taken along line 2A—2A of a portion of FIG. 2.

Referring now to FIG. 2, another embodiment 10' of the diode includes a layer 14' comprising inert particles 24 (as shown in FIG. 2A) of another dielectric material such as particles 24 of titanium dioxide $TiO_2$ or magnesium carbonate $MgCO_3$ dispersed within the polymer binder 22 and the tantalum particles 20 having an oxide layer 20a. In this embodiment, a portion (e.g., 0% to 75%) of the tantalum particles 20 are replaced with inert dielectric material particles 24 such as the titanium dioxide or magnesium carbonate. The tantalum particles can optionally have an annealed oxide or other type of oxide layer disposed about the tantalum although, the intrinsic oxide layer 20a alone is preferred.

The addition of dielectric particles of e.g., titanium dioxide solids to the polymer binder 22 and the tantalum particles 20 can improve printing of the layer 14', enabling use of lower amounts of tantalum particles while still maintaining a high solids content that would exhibit good diode properties. This would be particularly desirable with very thin layers of the metal/insulating material layer to avoid shorting of the two electrodes 12 and 16 through the layer 14'. Including an inert material reduces the probability of shorting and provides a more consistent film/coating.

Moreover, at sufficiently low concentrations of tantalum, devices may be provided with higher switching voltages. It is anticipated that rather than using the oxide layer around the tantalum particles to act as the insulator, i.e., the potential barrier that electrons need to exceed in order to cause conduction, the barrier would be governed by the dielectric properties of the inert material, e.g., the titanium dioxide and the binder at the lower concentrations of tantalum.

Referring now to FIG. 3, another embodiment 10" of the diode has the first electrode 12 and the metal-insulating layer 14 or 14' on the first electrode. This structure 10" may give similar diode properties when a connection 28 is made to the metal-insulating layer 14 or 14'. By eliminating the second electrode, the device 10" can have fewer layers, changing the fabrication process without substantially altering the characteristics of the metal insulator layer.

Referring now to FIG. 4, the device of FIG. 1 can be prepared as follows: The process 30 includes mixing 32 tantalum powder that is 99.97% pure, having the intrinsic oxide layer and having a particle size less than e.g., 5 microns, with a polymer binder such as Acheson, Electrodag No. 23DD146A, or Acheson SS24686, a more thixotropic material. Both polymer binders are available from Acheson, Port Huron, Mich. Other binders can be used with the tantalum to form a tantalum ink. The binders should be electrically insulating, stable with tantalum or the other metal used and preferably have an relatively high e.g., 15% to 35% or so solids content. The tantalum can be in a range of 100% to 39% of the total weight of the binder. Other ranges could be used. The tantalum particles and binder are mixed well to produce the tantalum ink. The tantalum ink is printed 34 on the first electrode e.g., a copper foil substrate or on other conductive material. The layer is printed, for example, by either draw down bars, screen printing, flexo or gravure printing techniques. The layer is dried 36, e.g., in an oven at 120° C. for 15–20 minutes. A second conductive layer such as chromium in the form of chromium particles mixed in a binder material is printed 38 on the tantalum binder layer. This chromium layer is also dried 40 at e.g., at 120° C. for 15–20 minutes producing the device 10. Thereafter, the device 10 can be tested 42.

Alternative conductive layers or metals such as copper, tungsten, molybdenum, carbon and so forth can be used for the first and/or second electrode. The conductivity of this layer can be varied by changing relative concentrations of conductive material to binder. Exemplary ranges for conductive material are 30% to 39%. By varying the conductivity of this layer, the shape of the current-voltage characteristic curve can be varied, making it a little sharper producing a diode having a steeper on/off response.

Processing is simplified because the tantalum particles used have an intrinsic oxide layer 20*a*. There is no need to thermally anneal or otherwise thermally preprocess the tantalum powder. The intrinsic oxide coating is very consistent in thickness and quality. This tends to produce very consistent metal-insulator layer materials and hence diodes with switching voltages having relatively low standard deviations over a series of diodes.

Another advantage is that since there is no need to thermally anneal the tantalum powder, the properties of the ink can be adjusted to achieve various diode properties to fit different applications. Ink formulation may be an easier process to control than thermal processing of the tantalum.

This device could also be referred to as a varistor, i.e., a thin printed varistor. This M-I-M structure is good for applications that need a nonlinear element that operates at low voltages and perhaps low current that can be printed rather than using semiconductor deposition techniques.

Figure 5A:
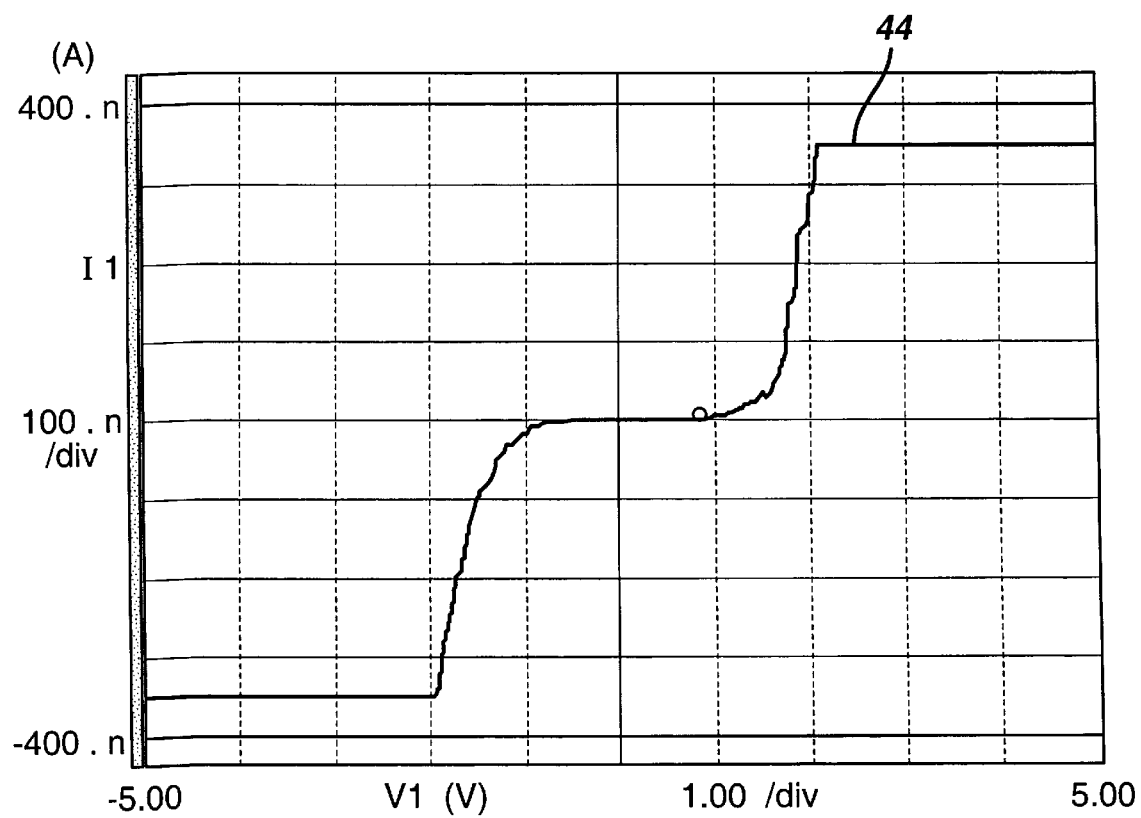
FIGS. 5A–5D are plots of voltage vs. current showing typical switching characteristics of M-I-M diode devices of FIGS. 1–4.

Referring now to FIGS. 5A–5D plots of voltage vs. current showing typical switching characteristics of M-I-M diode devices of FIGS. 1–5 are shown. As shown in FIG. 5A, a current voltage characteristic curve 44 for a M-I-M diode device exhibits a switching voltage at 100 na. (nanoamperes) of approximately 1.8 volts, with an on/off ratio that is calculated to be about 33. The current voltage characteristic curve 44 was obtained using a Hewlett Packard semiconductor analyzer, Model No. 4155B.

This device used a tantalum layer that was prepared by mixing 5 grams of tantalum particles obtained from Alfa Aesar, Ward Hill, Mass. having a particle diameter of less than 2 microns, with 20 grams of Electrodag 23DD146A polymer having a 25% solid versus 75% volatile compound composition. The ink was coated onto a conductive surface of copper foil using a 15 mil cutout i.e., to produce a layer having a wet thickness of 15 mils. The sample was dried in an oven at 120° C. for 20 minutes. The ink for the second layer of the diode was prepared by mixing 5 grams of chromium powder with a particle size of less than 5 microns as received from Alfa Aesar with 4 grams of Electrodag 23DD146A and was coated on top of the tantalum ink layer using a 5 mil cutout. This coating was dried for 20 minutes at 120° C.

Figure 5B:
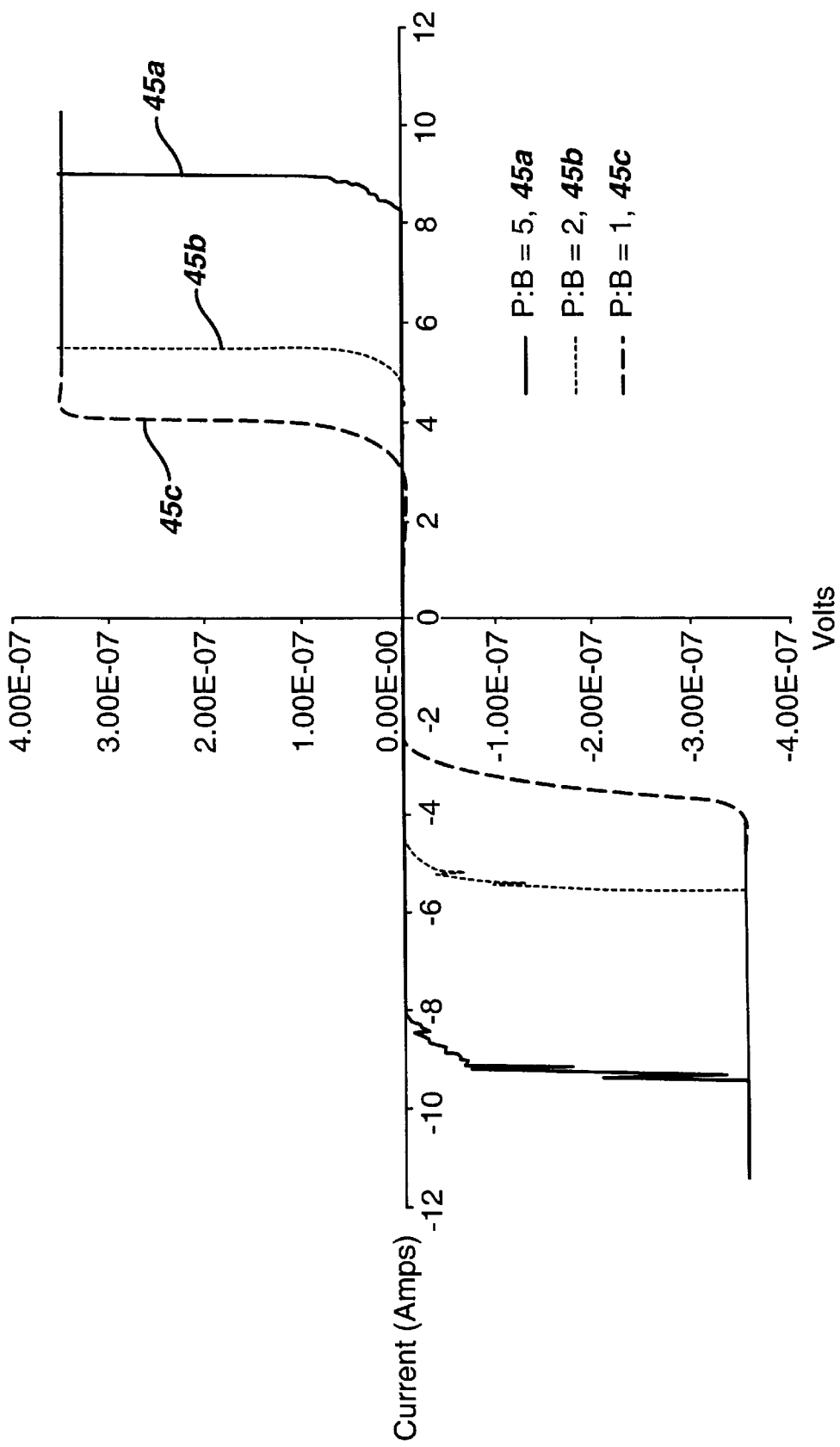

As shown in FIG. 5B, the M-I-M diodes can exhibit different switching voltages based upon different "P:B" ratios, that is, different ratios of metal (e.g., tantalum) particles to binder. As shown in FIG. 5B, for the same thickness of 15 mils, with P:B ratios of 5, 2, and 1, devices exhibit switching voltages of approximately 9 volts (curve 45*a*), 5.3 volts (curve 45*b*) and 3.8 volts (curve 45*c*) at 100 nano amperes.

Figure 5C:
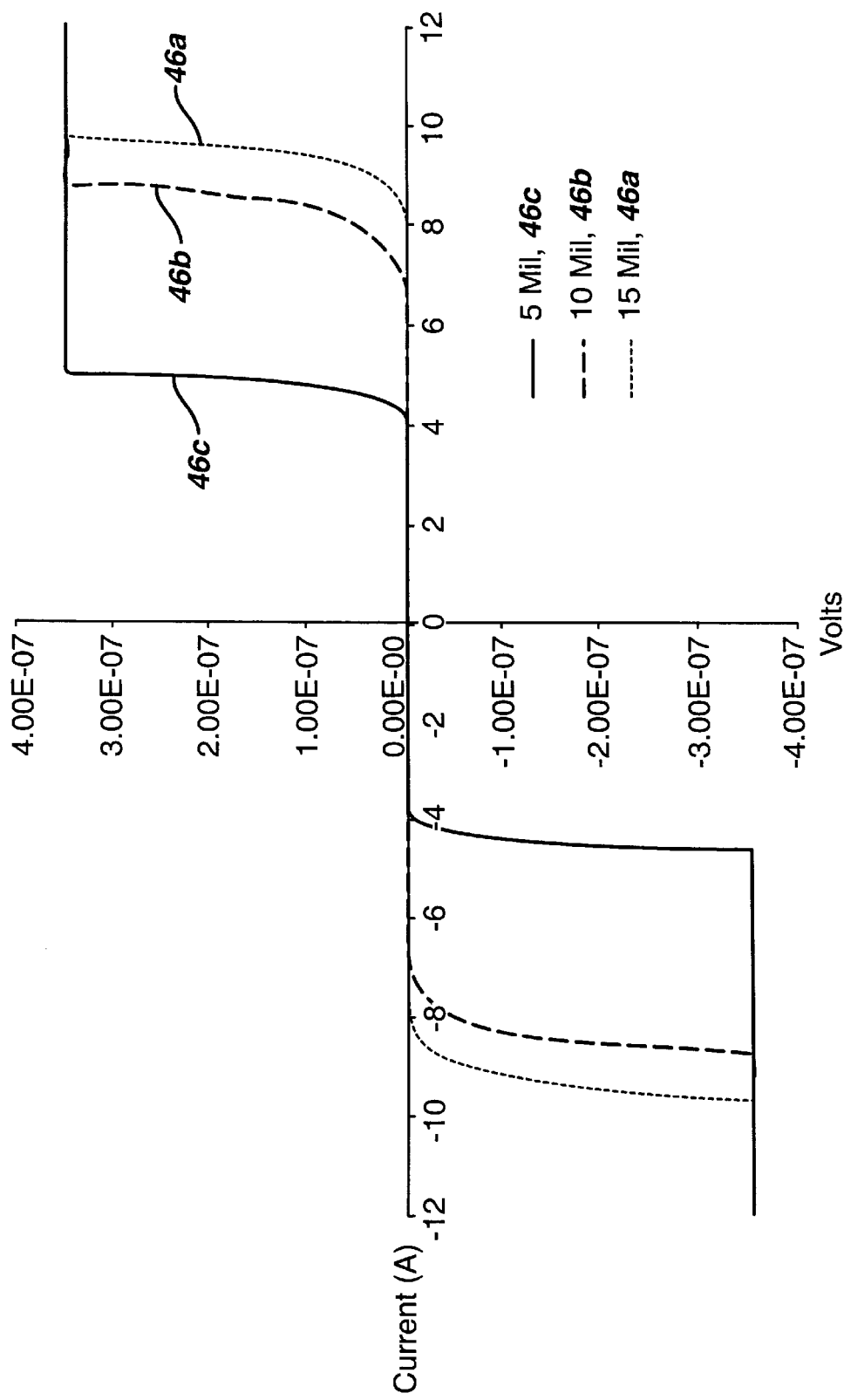

As also shown in FIG. 5C, varying the wet thickness of the tantalum layer can also produce varying switching voltages. With a tantalum layer having a tantalum to binder ratio (P:B) of 8:1, a M-I-M diode having a 15 mil thick tantalum layer would exhibit a switching voltage of approximately 9 volts (curve 46*a*), a 10 mil thick layer would provide a M-I-M diode with a switching voltage of approximately 7.8 volts (curve 46*b*), and a 5 mil thick layer would provide a M-I-M diode with a switching voltage of approximately 4.6 volts (curve 46*b*). Each of the switching voltages are measured at 100 nano amperes.

Figure 5D:
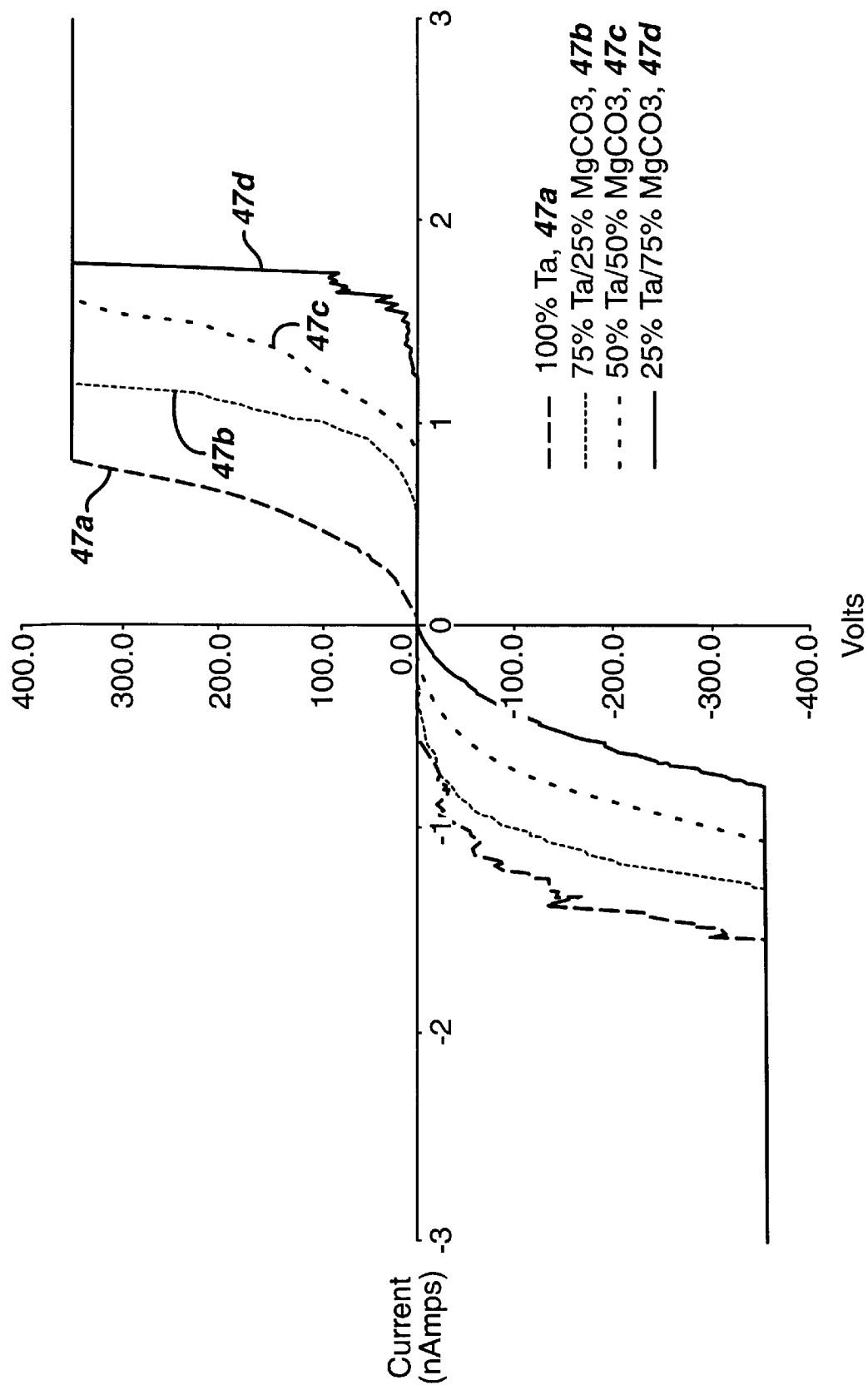

Referring now to FIG. 5D, addition of magnesium carbonate to the tantalum layer can produce M-I-M diodes that have consistently high on/off ratios with minimal impact on switching voltage. As shown in FIG. 5D, as the amount of magnesium carbonate is increased, the switching voltage characteristic becomes steeper. The curve 46*a* shows the switching characteristic for a 100% tantalum layer having a P:B ratio of 1:1 that exhibits a switching voltage of 1.8 volts. Curves 47*b*–47*d* illustrate that as the amount of magnesium carbonate increases, the switching characteristic becomes steeper therefore indicating a better on/off ratio.

Figure 6:
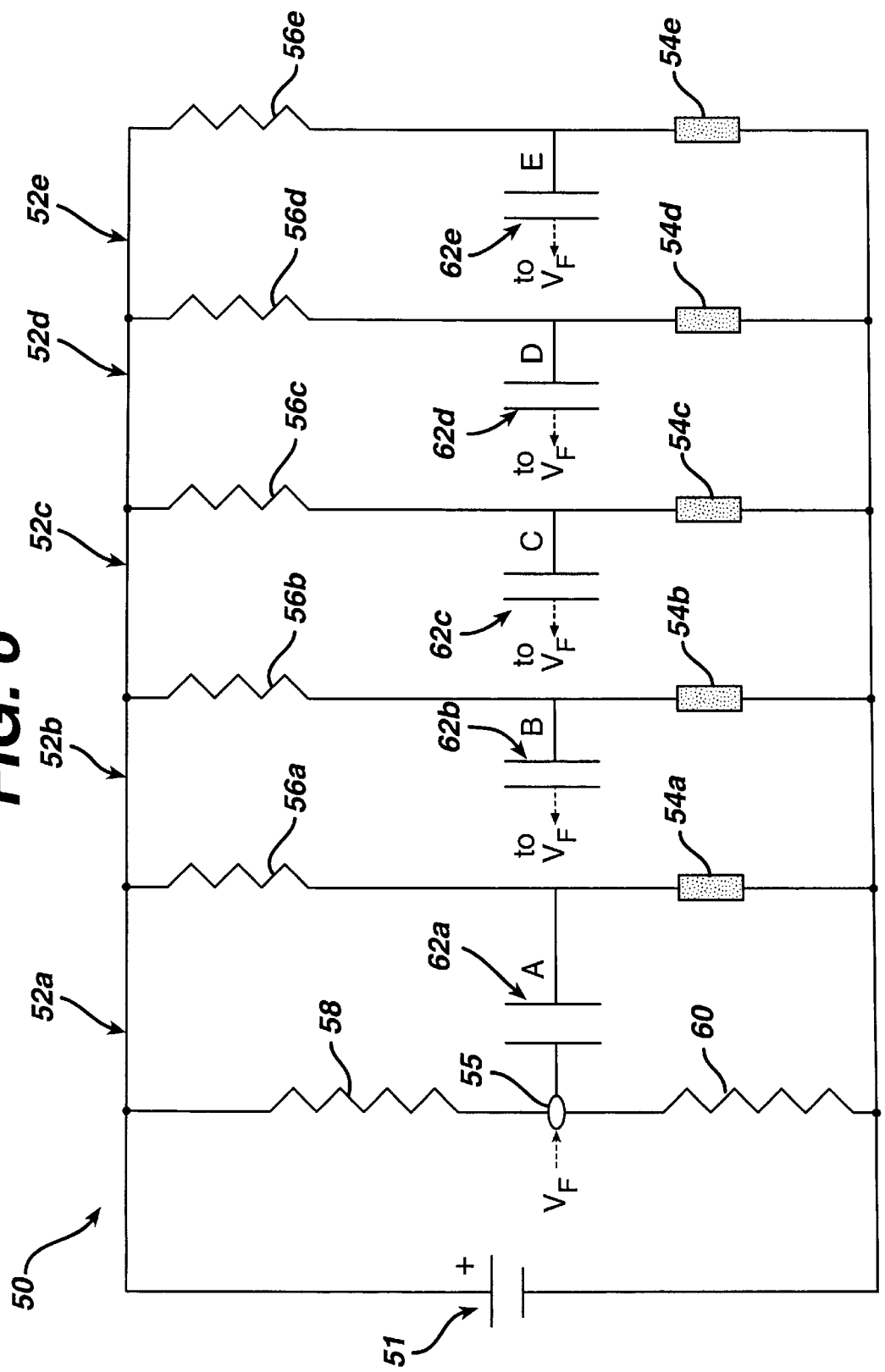
FIG. 6 is a schematic diagram of a multiple nonlinear element segmented display battery tester.

Referring now to FIG. 6, a multiple, nonlinear element battery tester 50 is shown connected to a battery 51. The multiple, nonlinear element battery tester 50 is comprised of a plurality of individual, nonlinear element battery testers 52*a*–52*e* coupled to provide a parallel circuit. Each of the individual, nonlinear element battery tester circuits 52*a*–52*e* include a non-linear element such as a M-I-M diode 54*a*–54*e*, respectively, and a film resistor 56*a*–56*e* respectively. The battery tester 50 includes a voltage divider provided by two resistors, 58 and 60 coupled in parallel with the plurality of individual non-linear element battery testers 52*a*–52*e*. Each of the individual non-linear element battery testers 52*a*–52*e* includes a corresponding one of a plurality of display devices 62*a*–62*e* disposed between an electrode 55 (potential $V_f$), and a common connection of the respective parallel circuits 52*a*–52*e* of the non-linear elements, i.e., M-I-M diodes 54*a*–54*e* and the film resistor 56*a*–56*e*.

The display devices 62*a*–62*e* are of a ultra-low current, low voltage, voltage controlled display type. One type of display devices 62*a*–62*e* are an electrophoretic display device such as described in "All Printed Bistable Reflective Displays: Printable Electrophoretic Ink and All Printed Metal-Insulator-Metal Diodes" Massachusetts Institute of Technology June 1998 and provided by E-INK, Inc. Cambridge, Mass., that are modified to include low switching voltage devices as described above in FIGS. 1–5D.

This type of display is based on so called "electronic inks", e.g., electrophoretic materials that change their properties e.g., color based on an applied voltage. Using electrophoretic materials such as electronic ink, a flat panel display can be printed on a substrate material. These displays draw very little current and hence dissipate very little power. Any voltage sensitive material could be used as the display. Another material that has been described in "The Reinvention of Paper", Scientific American, September 1996, called Gyricon which is also voltage sensitive. The display needs to operate at voltages that are within the range of the voltage of battery.

The non-linear devices 54a–54e can be the M-I-M diode described above in conjunction with FIGS. 1–5A–5D.

The multiple, nonlinear element battery tester 50 has five different diodes, in five parallel paths. If the diodes are constructed to switch at a different voltage, the displays would change state at different voltages producing a segmentation of the display or a gauge effect that would indicate charge status of the battery.

The multiple, nonlinear element battery tester 50 has one terminal of each of the displays 62a–62e coupled to a common voltage potential labeled as $V_f$. The voltage potential $V_f$ is derived from a point between the two resistors, 58, 60, and if resistors 58 and 60 are equal, provides $V_f$ at one-half of the voltage of the cell. The different parallel segments 52a–52e have a value of voltage respectively, at points A–E where the magnitude of the voltage is set by the diodes 54a–54e and the resistor elements 56a–56e. The different parallel segments 52a–52e can be set to have monotonically increasing or decreasing values of voltage at points A–E. For example, for a 9 volt battery, one diode 54a could be selected to switch at 8 volts, diode 54b could be selected to switch at 7 volts, diode 54c could be selected to switch at 6 volts, and so on, so that as the voltage of the battery drops, different segments of the displays 62a–62e turn off.

The diodes 54a–54e can be set to switch at different voltages that would either turn "on" or turn "off" the display, i.e., change from one color to another color depending on how the display is connected to the circuit. The number of segments is only limited by how well the diodes can differentiate different voltages. In the 9 volt example, a one volt difference was used. But if the diodes are fabricated to produce exactly 1/10 of a volt difference the battery tester can have 1/10 of a volt switching difference and the battery tester can be expanded out to 15 or 60 segments or more segments.

The current drawn from the battery can be selected to depend on the values of resistance of the voltage divider of resistors 58 and 60. The display devices 62a–62e draw very little current.

Since diodes 54a–54e are non-linear, at some point as diodes 54a–54e switch they will cause the voltage at electrode 55 to become negative with respect to the voltage of respective ones of the electrode coupled to points A–E. This would cause corresponding flips or changes in the polarity on the displays 62a–62e, causing the displays 62a–62e to change color indicating that the battery is loosing charge. When the last one of the displays e.g., 62e changes color it could indicate that the battery 51 is no longer within some defined specification.

Figure 7:
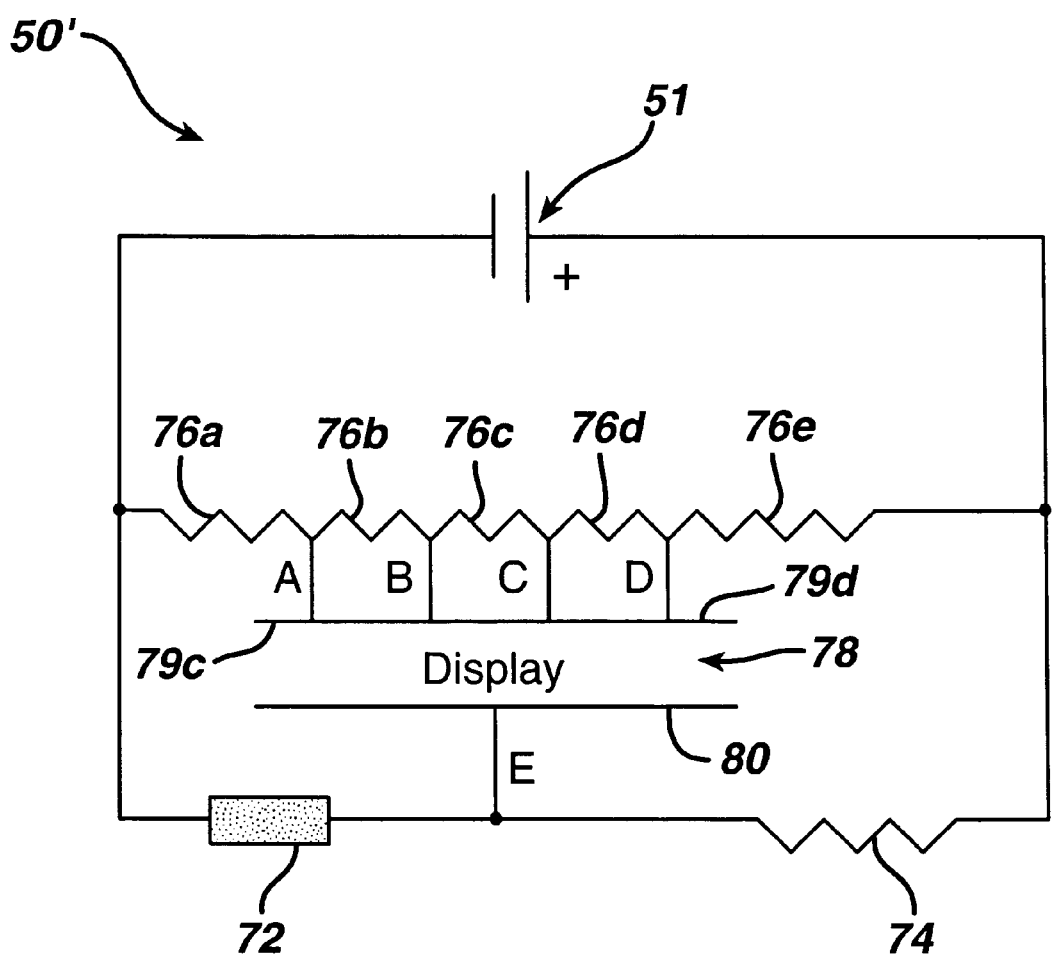
FIG. 7 is a schematic diagram of a multiple resistor, variable display battery tester.

Referring now to FIG. 7, an alternate embodiment 50' of a multiple, nonlinear element battery tester 50 is shown connected to a battery 51. In this battery tester 50', segmentation i.e., a gauge effect, is provided by using different resistors with a common, segmented display device 78. The battery tester 50' includes a parallel circuit. On one side of the parallel circuit is a nonlinear element, e.g., a M-I-M diode 72 and resistor 74. On the other side, rather than just having the two resistor elements to split the current, as the battery tester 50 of FIG. 1, the battery tester 50' includes a plurality of resistors e.g., five, 76a–76e. The plurality of resistors 76a–76e are coupled to corresponding electrodes 76a–76d of a display 78 that has a second electrode 80 coupled at the connection of the non-linear element 72 with the resistor 74 which is at a potential E. The voltage at, any point A–D along the display 78 is equal to the sum of the resistance up to that point divided by the total resistance, as shown below for Equations 1–4.

$$V_a = V_{battery} \frac{R_1}{R_1 + R_2 + R_3 + R_4 + R_5} \quad \text{Equation 1}$$

$$V_b = V_{battery} R_1 + \frac{R_2}{R_1 + R_2 + R_3 + R_4 + R_5} \quad \text{Equation 2}$$

$$V_c = V_{battery} R_1 + R_2 + \frac{R_3}{R_1 + R_2 + R_3 + R_4 + R_5} \quad \text{Equation 3}$$

$$V_d = V_{battery} R_1 + R_2 + R_3 + \frac{R_4}{R_1 + R_2 + R_3 + R_4 + R_5} \quad \text{Equation 4}$$

The voltage $V_E$ at point E is relatively constant throughout the life of the cell and the voltages $V_A$, $V_B$, $V_C$ and $V_D$ will vary with respect to the voltage $V_E$ at point E. There will be different points at which the values of the voltages at points A, B, C and D are positive with respect to point E or negative. When there is a polarity change there is a corresponding change color of the display. The difference in the values of resistors 76a–76e can be easily varied by printing different widths of conductive material.

Preferably, all of the resistors 76a–76e are printed with a transparent conductive material such as ITO (indium tin oxide) and suspended in a polymer binder material. The conductivity of the printed layers can be varied by changing the amount of ITO dispersed in the polymer binder with low levels of ITO producing films of high resistance. A circuit with an overall resistance of 15 meg-ohms between anode and cathode would produce a current draw of 100 nano-amps (na). This relatively low current draw would have a impact on cell capacity of only about½ percent.

Figure 8:
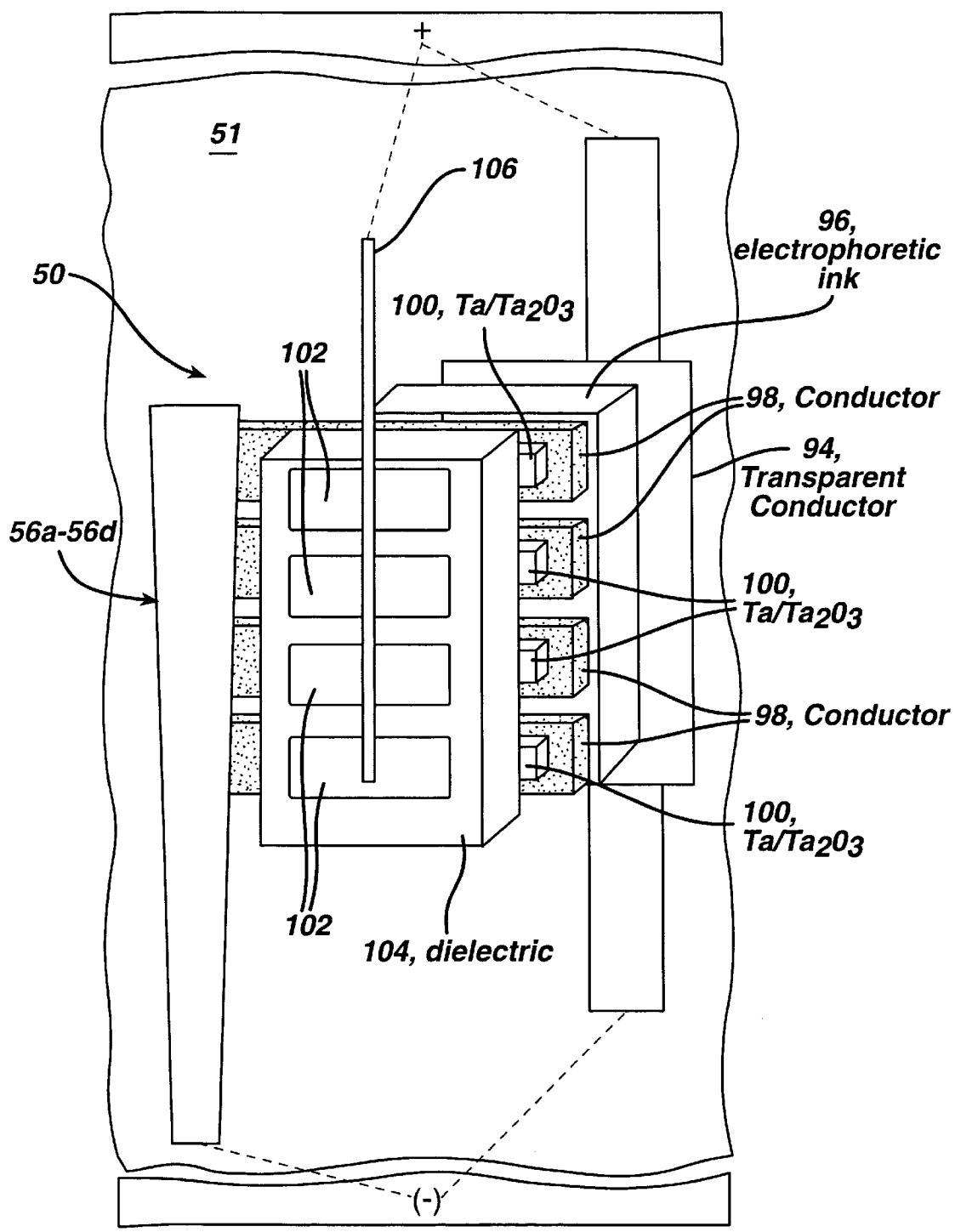
FIG. 8 is a diagrammatical, perspective view of a construction example for a multiple nonlinear element battery tester of FIG. 6.
Figure 9:
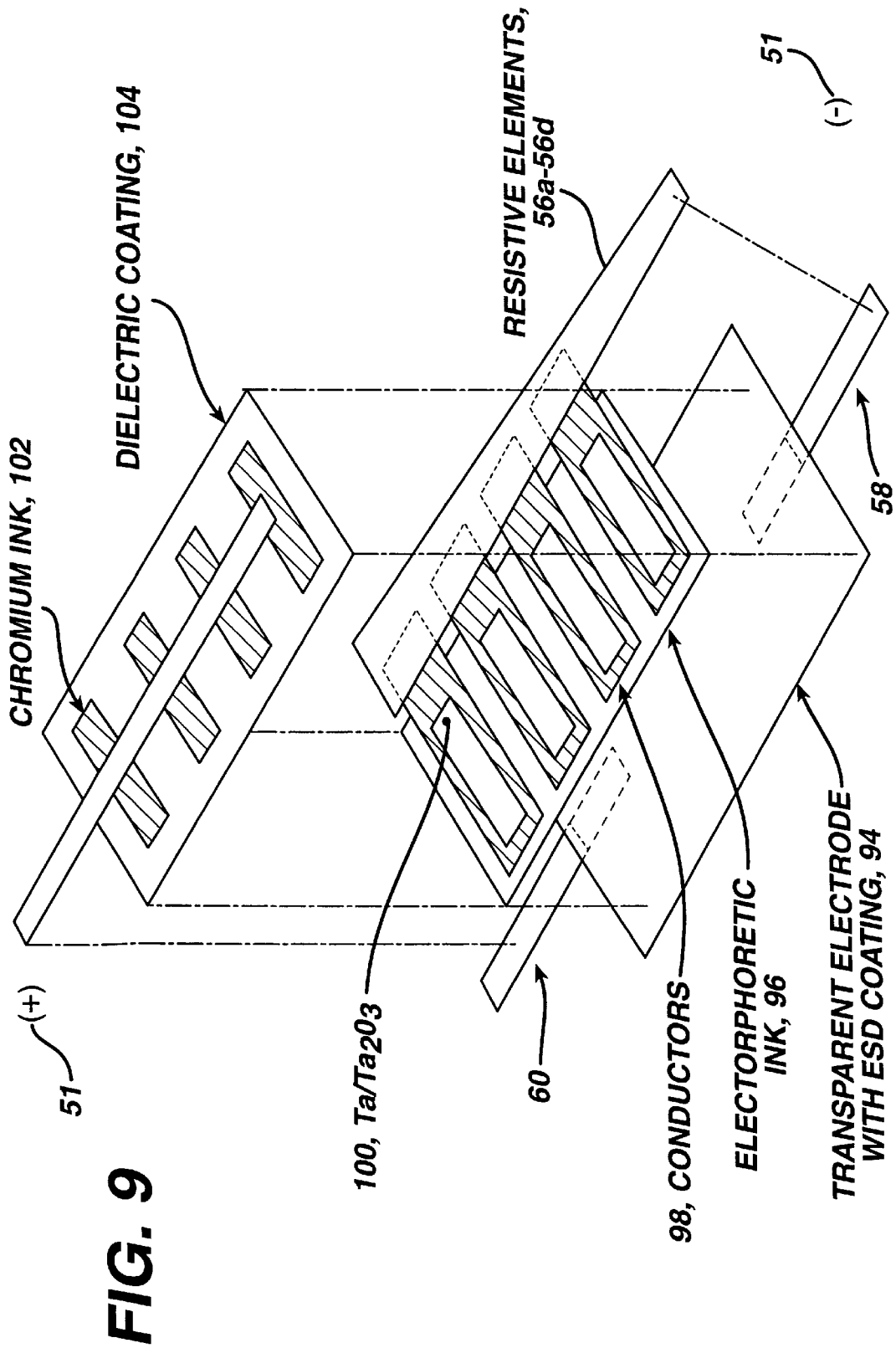
FIG. 9 is a diagrammatical view of a construction example for the multiple nonlinear element battery tester of FIG. 6.

Referring now to FIGS. 8 and 9, an example of the battery tester 50 (FIG. 6) is shown. A transparent conductor 94, e.g, a material such as an ITO (indium tin oxide) ink or a transparent coating used for electrostatic dissipation is printed on the cell or label of the battery 51. Examples of the material of the transparent conductor, include an electro-static coating. The transparent conductor 94 need not carry a high current because the displays 62a–62e (FIG. 1) are voltage sensitive displays. The transparent conductor is merely a current carrying material. The transparent conductor 94 is attached to resistors 58, 60 which attach to the anode or the cathode, so the transparent conductor 94 is attached between the anode and the cathode. The attachment of resistors 58, 60 to the anode and the cathode of battery 51 can be provided by glueing, crimping or other arrangements.

Resistors 58–60 may be formed from strips of material having different widths or thicknesses to provide different resistances. On top of the transparent conductor 94, the display is printed. This display could be the electrophoretic ink display mentioned above or it could be a Gyricon based display or any other voltage sensitive material that produces a change in color by varying an applied voltage.

The display includes an electrophoretic ink material 96 that is printed on the transparent conductor 94. On top of the electrophoretic ink material 96, a first conductor 98 of the display is printed. This conductor 98 couples one side of the display to one of the poles of the battery, either the anode or the cathode, depending on how the display is to be initially switched. This conductor 98 is also printed in segments and is coupled to resistors 56a–56d (FIG. 6, only four used in this example). If the conductor 98 is printed as one solid conductor, the conductor would carry a uniform voltage. Printing the conductor in sections gives a segmentation, e.g., gauge effect.

The diodes 54*a*–54*d* (FIG. 6, only four used in this example) are printed by depositing a tantalum layer segments 100 having tantalum particles with an intrinsic oxide coating in a dielectric binder as described above. The intrinsic oxide has a sufficient thickness to provide M-I-M diodes. In order to vary the characteristics of the parallel paths, these segments can be at different thicknesses to give different diode properties. This provides a different switching voltage for each diode.

A second electrode 102 such as a chromium layer is printed on top of the tantalum layer. The second electrode 102 is surrounded by an optional dielectric coating 104 to insure that short circuits are avoided. A second conductor 106 is printed on top of the second electrode 102 to connect all the chromium layers together. The second conductor 106 is connected to the opposite pole of the battery from the first conductor 94, either anode or cathode depending on which pole the first conductor 98.

Figure 10:
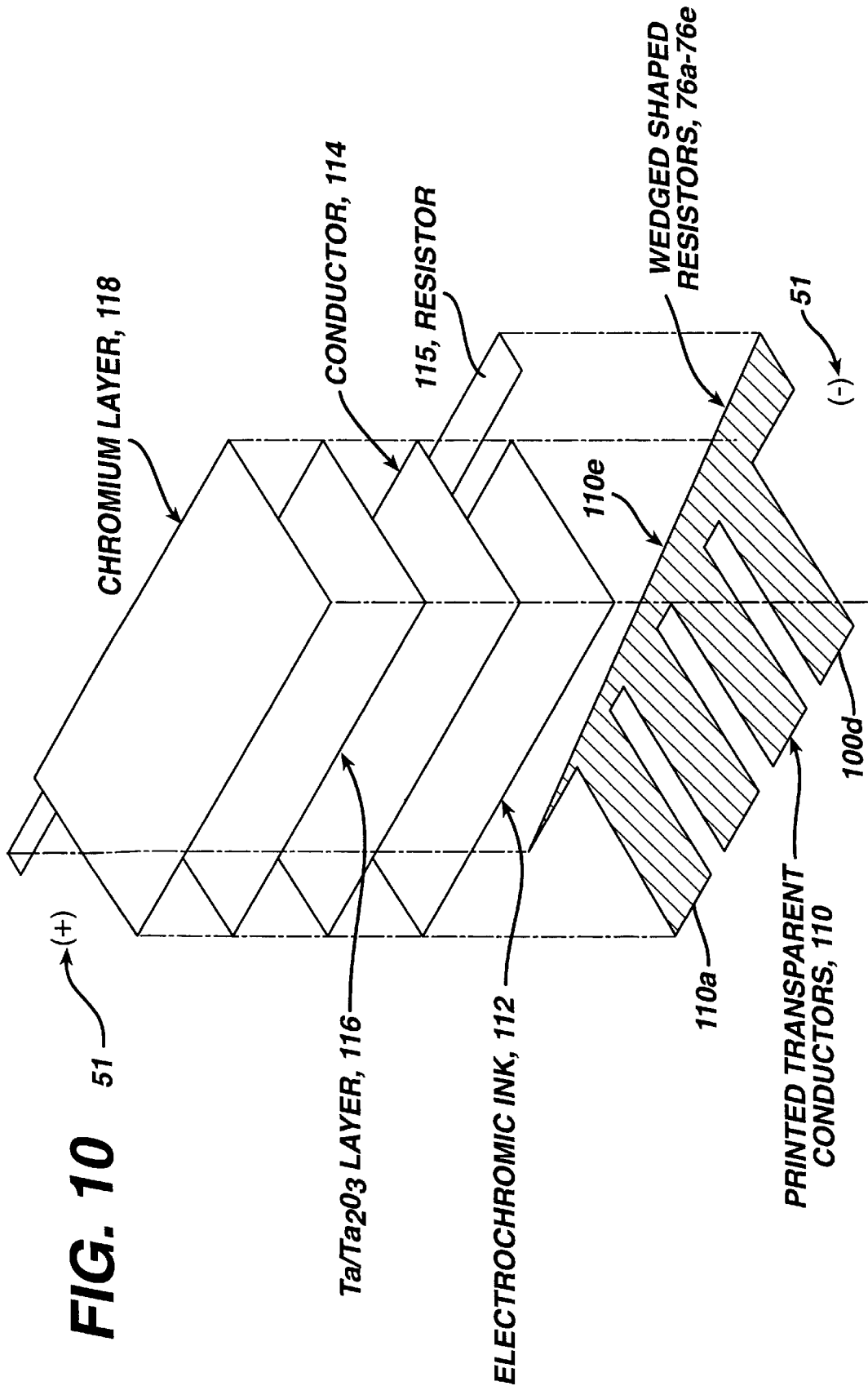
FIG. 10 is a diagrammatical view of a construction example for the multiple resistor battery tester of FIG. 7.

Referring now to FIG. 10, an example of the multiple resistor battery tester 50' is shown. The battery tester 50' is laid-out very similar to the battery tester 50. A transparent conductor 110,is printed in different sections 110*a*–110*d* to provide segmentation i.e., the battery charge gauge. The transparent conductor 110 is printed to include a wedge-shaped conductor portion 110*e* to produce resistors 76*a*–76*e*. The wedge-shape conductor portion 110*e* has a resistance characteristic that varies along the conductor length so that at the narrower end it has a higher resistance while at the wider end it has a lower resistance. The conductor portion 110*e* could also be a single width where the resistance at any point in the conductor would depend on how far that point was from one pole of the battery. Other arrangements are possible.

The wedge-shaped conductor portion 110*e* is connected to both the anode and the cathode of battery 51 such as by glueing or crimping or other arrangements. On top of the transparent conductor 110 is printed the display material 112, e.g., the E-Ink or Gyricon or other voltage sensitive material. Over the display material 112 another conductor 114 is printed. One end of the conductor 114 is connected via resistor 115 to one of the poles of the cells, either the anode or the cathode. On top of that conductor, a tantalum oxide/tantalum metal layer 116 is printed and on top of tantalum oxide/tantalum metal layer 116, the second electrode 118 e.g., a chromium layer is printed. The second electrode 118 is connected to the opposite pole of the cell.

Since the battery tester 50 or 50' is a printed device, the non-linear device can be provided with carbon ink based electrodes as described above. The resistors can also be carbon-based with a dielectric filler to reduce the conductivity of the resistors making them more resistive. Ideally the entire battery tester 50 should have a very high total resistance, e.g., on the order of 15 meg-ohms. For a 1.5 volt cell that would provide a tester 50 or 50' that draws 100 nano-amps which is a low enough current level to have a minimum impact on the lifetime of the battery. For example, for a "double A" cell with a 7 year lifetime, a 100 nano ampere draw would consume only about 0.5 percent of the battery's capacity.

Typical thicknesses for the layers in the battery testers can be as follows: The transparent conductor could have a thickness between 0.1 to 0.2 mils; the display medium 1.0 mil; the electrode layers 0.1–0.2 mils; tantalum layer for the M-I-M diode 0.5–1.0 mils and various dielectric layers 0.2–0.5 mils. Other thicknesses could alternatively be used.

Referring now to FIG. 11, a battery 51' having a battery tester 150 with a segmented display is shown. The battery tester 150 includes a first plurality of segments 154*a*–154*g* disposed in a second plurality of columns 156*a*–156*g* along the length of the battery 51'. The battery tester 150 can be provided by using one tester that is disposed around the battery 51'. In the battery tester 150, the battery tester 150 is turned sideways around the battery 51'. The battery tester 150 is arranged such that successive ones of the segments 154*a*–154*g* turn on or off at different voltage levels to give an indication of the power remaining in the battery 51'.

Thus, as an example, for a given condition of the battery 51', the battery tester 150 can have all segments 154*a* and 154*b* in all columns 156*a*–156*g* turn on to indicate that the battery has spent "two sevenths" (2/7) of its useful life. The battery tester 150 is incorporated over the entire circumference of the battery 51'. Therefore, a consumer does not have to hold the battery in one orientation to look at the display, since the display is visible from any orientation.

Referring now to FIG. 12, a battery 51" including a battery tester 162 with a variable display is shown. The battery tester 162 is comprised of individual battery testers 164 that are printed in columns 166*a*–166*g* that are disposed around the circumference of the battery 51". Thus, unlike the battery tester 150 (FIG. 11), i.e., a tester that is expanded all around the cell, the battery tester 162 is comprised of a series of battery testers 164 arranged in vertical columns 166*a*–166*g* along the height of the battery 51".

Figure 13:
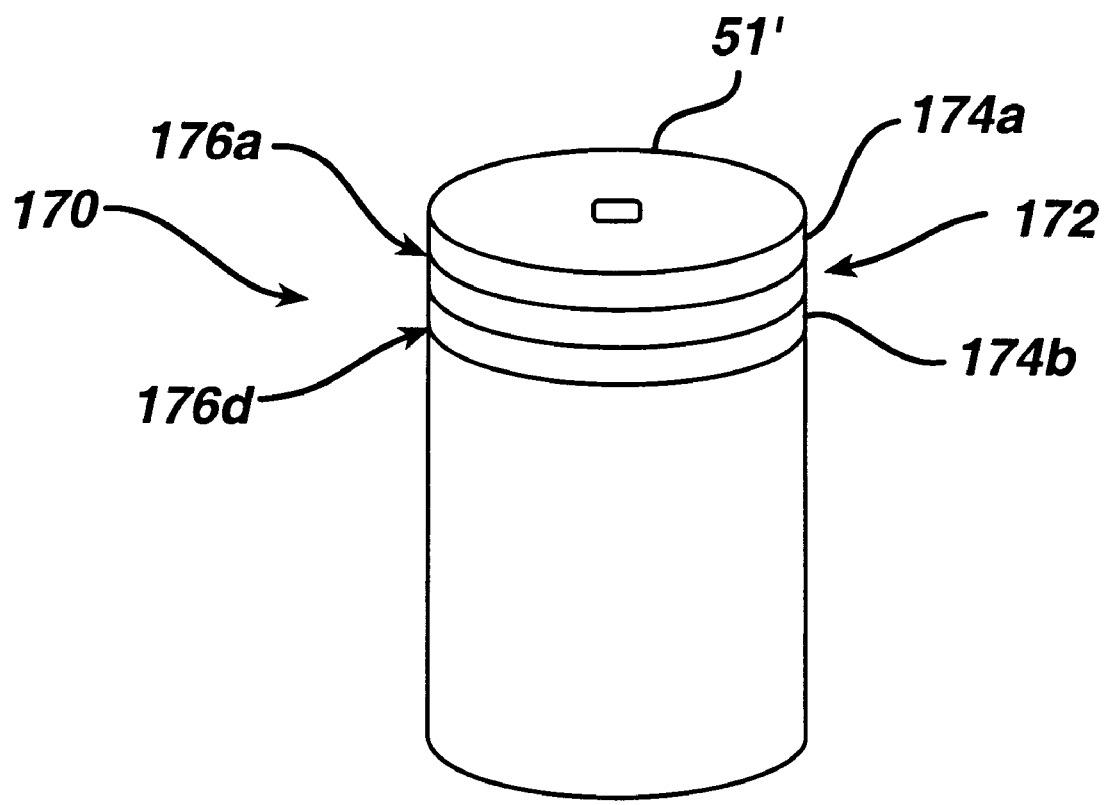
FIG. 13, is a diagrammatical view of an alternative arrangement for a battery having a segmented battery tester display.

Referring to FIG. 13, an alternative arrangement 170 for a battery 51' having a segmented battery tester display 172 is shown. The segmented battery tester display 172 includes a plurality of segments 174*a*–174*d* disposed in a plurality of rows 176*a*–176*d* in a band around an upper portion of the battery 51'. The segmented battery tester display 172 can be provided by using one segmented tester that is disposed around the battery 51'. In the segmented battery tester display 172, the segmented battery tester display 172 is turned sideways around the battery 51'. The segmented battery tester display 172 is arranged such that successive ones of the segments 174*a*–174*d* turn off at different voltage levels to give an indication of the power remaining in the battery 51'. This arrangement could be used to replace a gold band found around an upper circumference portion of batteries from Duracell® Gillette, Inc. Boston Mass. As the battery capacity is consumed, the gold band could change to a different color or disappear to indicate remaining capacity.

Figure 14:
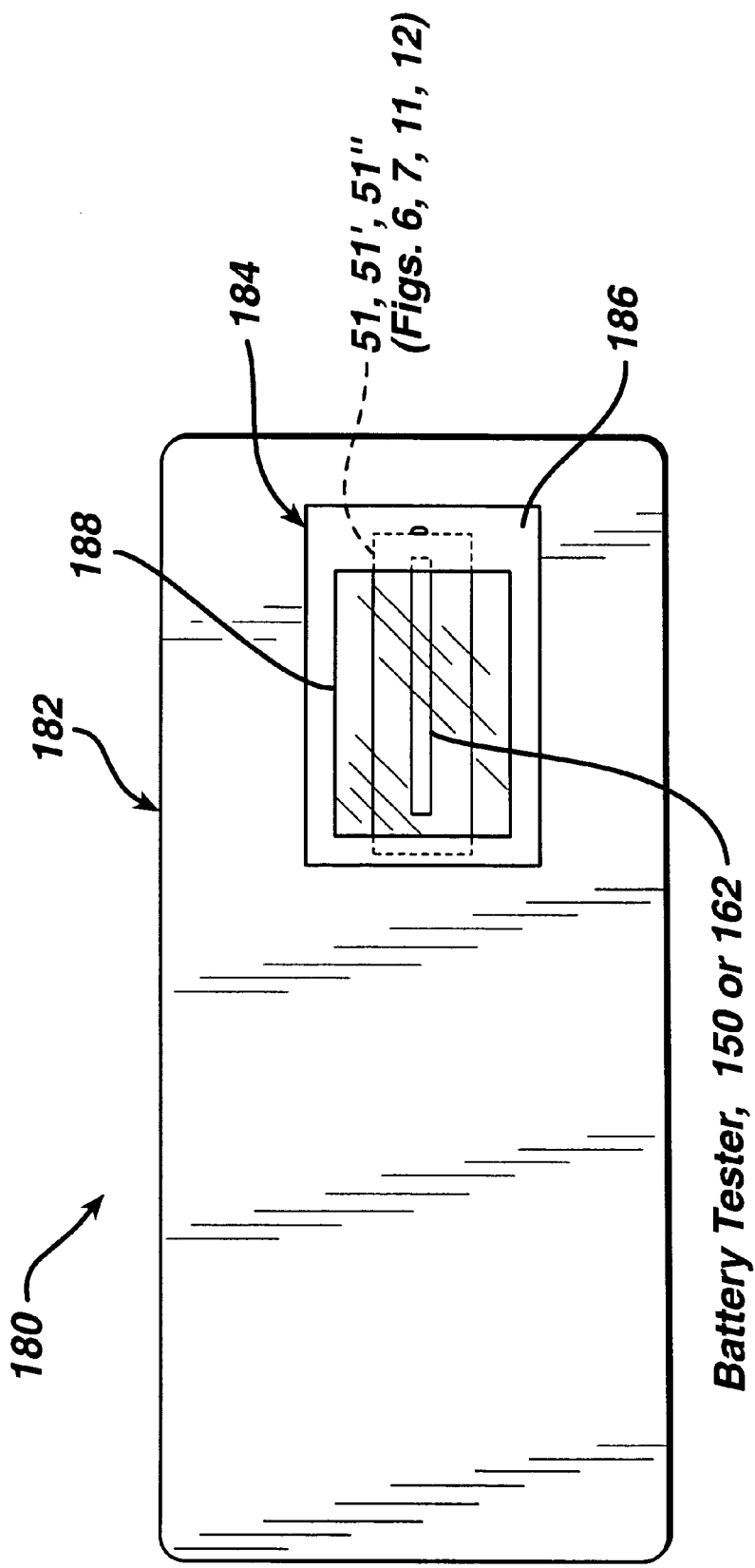
FIG. 14 is a diagrammatical view of a battery operated device having a battery compartment.

Referring now to FIG. 14, a electronic device 180 includes a body 182 having a battery compartment 184 with a door in 186. A battery, as shown can be placed in the battery compartment. The door 186 has a transparent window 188, through which a consumer can see the battery 51' or 11" and read the display of the battery tester 150 or 162 for those testers that can be considered as passive testers, i.e., those that do not require any action on the part of the consumer to activate 62 (FIG. 6) or 78 (FIG. 7). The electronic device can be any type of consumer device including without limitation, a calculator, cellular telephone, toy, radio and so forth. The transparent window could be part of the door or indeed could be the entire door.

Alternatively, the battery tester 150 (FIG. 6) or the battery tester 162 (FIG. 7) can be implemented with active battery testers i.e., those that require some consumer action such as manually closing a switch to electrically connect the tester to the battery electrode(s). In order to allow for inspection within the battery compartment of an electronic device, the compartment can be provided with an external lever or linkage (not shown) that would permit the user to test the battery having a manual type of tester.

While the battery tester displays 150 and 162 were described as being disposed around the entire circumference, other arrangements are possible. For example, they could be disposed in quadrants or even about ⅔ to ¾ about the entire circumference of a battery. Moreover, to accommodate other information on the label they do not have to extend over the entire or substantially entire length or circumference of the battery, but could be a portion of the length or circumference.

Moreover, other types of tester could be used. For example, rather than using a tester that gives a gauge effect, a tester that merely gives a good or bad indication could also be used, as will now be described.

Figure 15:
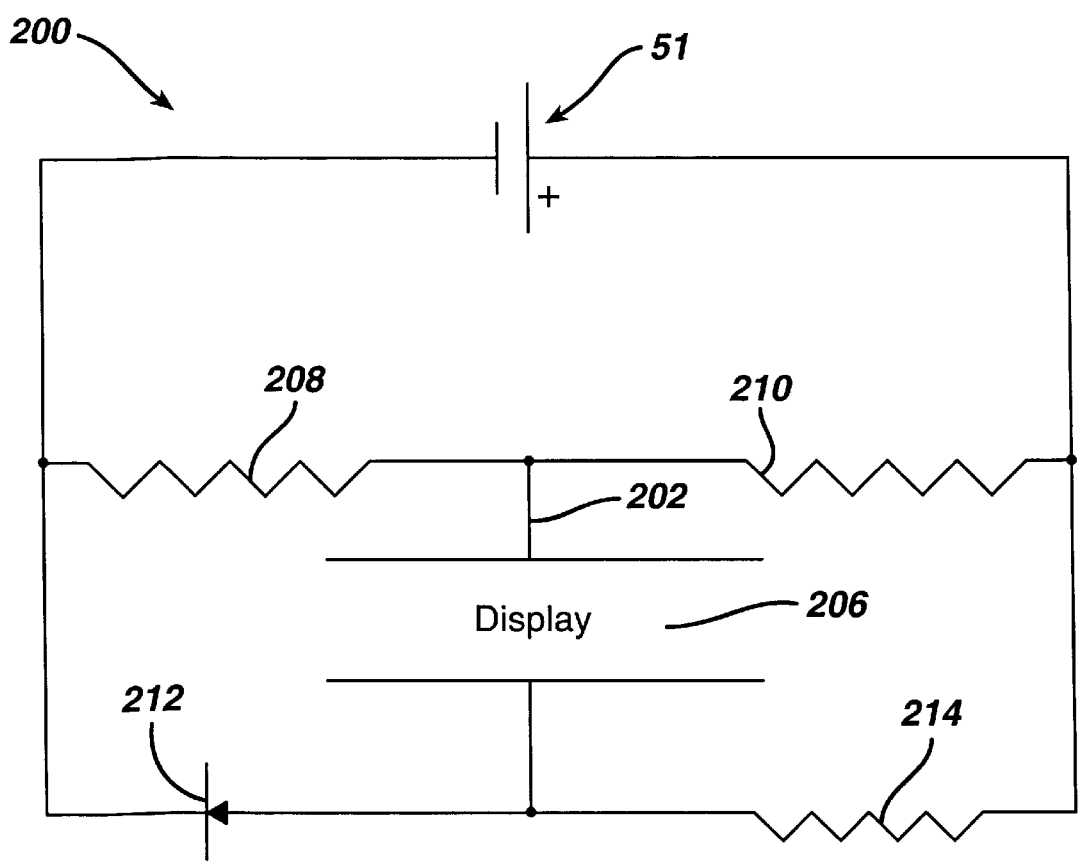
FIG. 15 is a schematic view of a on/off battery tester incorporating a voltage controlled display.

Referring now to FIG. 15, a good/bad indicator battery tester 200 is coupled to a battery 51. The battery tester 200 A includes a parallel circuit including a display device 206 disposed between two electrodes 202, 204 that are in parallel. Electrode 202 is connected to the circuit 200 at a voltage divider provided by two resistors, 208 and 210. Electrode 204 is connected to the other side of the parallel circuit. The other side of the parallel circuit has a nonlinear element, i.e., a switch 212 and a third resistor 214. The display device 206 is an ultra-low current, voltage controlled type of display. The non-linear device 212 is a M-I-M diode as described above.

The voltage potential at terminal 202 will always have, half of the battery cell voltage across it if the value of resistor 208 equals the value of resistor 20. The potential of the electrode 204 is determined by voltage across the nonlinear element 212 and resistor 214. The voltage at terminal 202 will start at a known value depending on the values of resistors 208, 210 and 214. As current is drawn from the battery due to use or leakage, the voltage of electrode 202 will vary with respect to the voltage at electrode 204. Since element 212 is non linear, at some point it will switch causing the voltage at electrode 202 to become negative with respect to the voltage of electrode 214. When the non-linear element switches, this would flip the polarity on the display causing the display to change color indicating that the battery is no longer within some defined specification. The display can be wired into the circuit so that either color of the display can indicate that the battery is no longer within some defined specification. In either event the battery tester works on the principle that the display exhibits a change in color when there is a change in the status i.e., good to bad of the battery cells.

Since the battery tester 200 is a printed device, the non-linear device can be provided with carbon ink based electrodes, as described in the above pending application. The resistors can also be carbon based and include a filler to reduce the conductivity of the resistors to make them more resistive. Ideally the entire battery tester 200 should have a very high total resistance, e.g., on the order of 15 meg-ohms. For a 1.5 volt cell that would provide a tester 200 that draws 100 nano-amps (na) of current which is a low enough current level to have a minimum impact on the lifetime of the battery. For example, a "double A" cell with a 7 year lifetime, a 100 na draw would consume only about 0.5 percent of the battery's capacity.

Other Embodiments

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A metal insulator device comprising:

a conductive layer; and a metal-insulator layer of particles of a refractory metal that forms an intrinsic oxide when exposed to ambient oxygen, said particles having the intrinsic oxide layer uniformly over the particles and being suspended in a dielectric binder, with the dielectric binder contacting the intrinsic oxide layer on the particles.

2. The device of claim 1 wherein the first conductive layer forms a first electrode of the device and is comprised of at least one selected from the group consisting of copper, carbon, gold, chromium, molybdenum and tungsten.

3. The device of claim 1 further comprising:

a second conductive layer disposed to be in direct contact with the metal-insulator layer providing a second electrode of the device and is comprised of at least one selected from the group consisting of copper, carbon, gold, chromium, molybdenum and tungsten.

4. The device of claim 1 wherein said refractory metal particles comprise tantalum or niobium.

5. The device of claim 4 wherein the binder of the metal insulator layer includes a thixotropic material.

6. The device of claim 5 wherein the thixotropic material is a polyvinyl resin.

7. The device of claim 1 wherein the dielectric binder material is a polyvinyl resin.

8. The device of claim 1 wherein the device is a diode that exhibits a symmetric switching characteristic.

9. The device of claim 1 wherein the intrinsic oxide thickness on the metal particles is from about 1 to about 10 monolayers of thickness.

10. The device of claim 4 wherein the intrinsic oxide thickness on the particles of tantalum is from about 1 to about 10 monolayers of thickness.

11. The diode of claim 1 wherein said refractory metal particles having the intrinsic oxide comprises one of tantalum or niobium.

12. The diode of claim 4 wherein the particles are comprised of tantalum.

13. A metal insulator diode device comprising:

a conductive layer;

a metal insulator layer comprising particles of a refractory metal having an oxide layer on the particles, said particles suspended in a dielectric binder vehicle;

a second conductive layer disposed to be in direct contact with the insulator metal layer;

wherein the insulator metal layer further comprises a dielectric filler material incorporated into the metal insulator layer.

14. The device of claim 13 wherein the first conductive layer forms a first electrode of the diode and is comprised of at least one selected from the group consisting of copper, carbon, gold, chromium, molybdenum, and tungsten.

15. The device of claim 13 wherein the first conductive layer forms a second electrode of the diode and is comprised of at least one selected from the group consisting of copper, carbon, gold, chromium, molybdenum, and tungsten.

16. The device of claim 13 wherein the metal insulator layer comprises particles of tantalum having an intrinsic oxide about the particles.

17. The device of claim 16 wherein the dielectric of the metal insulator level includes a thixotropic material.

18. The device of claim 17 wherein the thixotropic material is a polyvinyl resin.

19. The device of claim 13 wherein the dielectric filler material is magnesium carbonate.

20. The device of claim 13 wherein the dielectric filler material is titanium oxide.

21. The device of claim 20 wherein the dielectric filler material is comprised of spheres of titanium oxide and is intermixed with the tantalum oxide particles.

22. The device of claim 13, wherein the dielectric filler material is comprised of spheres of titanium oxide which are intermixed with the refractory metal particles having an oxide layer, and wherein said oxide layer is an intrinsic oxide layer.

23. The diode of claim 13 wherein the diode has a turn voltage range in the order of less than about plus/minus 10 volts.

24. A metal insulator diode comprising:

a conductive layer; and a metal-insulator layer of particles of a refractory metal having an intrinsic oxide surface layer having a thickness of from about 1 to about 10 monolayers, said particles being suspended in a dielectric binder including a thixotropic material.

25. The diode of claimw 24 wherein the first conductive layer forms a first electrode of the diode and is comprised of at least one selected from the group consisting of copper, carbon, gold, chromium, molybdenum and tungsten.

26. The diode of claim 24 further comprising:

a second conductive layer disposed to be in direct contact with the metal-insulator layer providing a second electrode of the diode and is comprised of at least one selected from the group consisting of copper, carbon, gold, chromium, molybdenum and tungsten.

27. A metal insulator diode comprising:

a first electrode of the diode comprised of at least one material selected from the group consisting of copper, carbon, gold, chromium, molybdenum, and tungsten;

a metal insulator layer comprising particles of a refractory metal having a uniform intrinsic oxide surface layer having a thickness of from about 1 to about 10 monolayers, said particles suspended in a dielectric binder vehicle, with said insulator metal comprising a dielectric filler material; and a second conductive layer disposed to be in direct contact with the metal insulator layer.

28. The diode of claim 27 wherein said electrode of the diode is comprised of at least one material selected from the group consisting of copper, carbon, gold, chromium, molybdenum, and tungsten.

29. The diode of claim 27 wherein said refractory metal particles having the intrinsic oxide comprises tantalum.

30. The diode of claim 27, wherein the dielectric of the metal insulator layer includes a thixotropic material.

31. The diode of claim 27 wherein the dielectric filler material is titanium oxide.

32. The diode of claim 29 wherein the dielectric filler material is comprised of spheres of titanium oxide intermixed with the tantalum particles having the intrinsic oxide.

33. The diode of claim 27 wherein the dielectric filler material is comprised of spheres of titanium oxide intermixed with the refractory metal particles having the intrinsic oxide.

34. The diode of claim 27 wherein the diode has a turn voltage range in the order of less than about plus/minus 10 volts.

* * * * *

UNITED STATES PATENT AND TRADEMARK OFFICE
CERTIFICATE OF CORRECTION

PATENT NO.     : 6,368,705 B1
DATED          : April 9, 2002
INVENTOR(S)    : Anne T. Lynch and Eric S. Gordon It is certified that error appears in the above-identified patent and that said Letters Patent is hereby corrected as shown below:

<u>Column 13,</u>
Line 27, replace "claimw" with -- claim --.

Signed and Sealed this

Eleventh Day of February, 2003

JAMES E. ROGAN
*Director of the United States Patent and Trademark Office*